United States Patent
Kim et al.

(10) Patent No.: US 10,804,498 B2
(45) Date of Patent: Oct. 13, 2020

(54) LIGHT EMITTING DISPLAY APPARATUS

(71) Applicant: LG Display Co., Ltd., Seoul (KR)

(72) Inventors: NamSu Kim, Paju-si (KR); YoungNam Lim, Seoul (KR); Seonghee Noh, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/525,320

(22) Filed: Jul. 29, 2019

(65) Prior Publication Data

US 2020/0058904 A1   Feb. 20, 2020

(30) Foreign Application Priority Data

Aug. 20, 2018  (KR) .......................... 10-2018-0096990

(51) Int. Cl.
*H01L 51/52* (2006.01)
*H01L 27/32* (2006.01)

(52) U.S. Cl.
CPC ...... *H01L 51/5268* (2013.01); *H01L 27/3244* (2013.01); *H01L 51/5206* (2013.01); *H01L 51/5221* (2013.01); *H01L 51/5275* (2013.01)

(58) Field of Classification Search
CPC .......................... H01L 51/5268; H01L 51/5253
See application file for complete search history.

(56) References Cited

U.S. PATENT DOCUMENTS

2013/0076238 A1* 3/2013 Fujita .................. H01L 51/5262
                                                            313/504
2014/0183462 A1* 7/2014 Lee ...................... H01L 51/5262
                                                            257/40
2015/0228929 A1   8/2015 Lamansky et al.

FOREIGN PATENT DOCUMENTS

KR   10-2015-0046116 A   4/2015

OTHER PUBLICATIONS

Kim et al., "The suppression of viewing angle dependence of top emission organic light emitting diodes having strong microcavity characteristics by applying concave patterned anode", Journal of the SID, 2018, 6 pages.

* cited by examiner

*Primary Examiner* — Jay C Chang
*Assistant Examiner* — Mikka Liu
(74) *Attorney, Agent, or Firm* — Birch, Stewart, Kolasch & Birch, LLP (57) ABSTRACT

A light emitting display apparatus can include a light emitting element disposed on a substrate; an encapsulation unit disposed on the light emitting element; and a scattering film disposed between the encapsulation unit and the light emitting element, or inside the encapsulation unit, the scattering film being configured to scatter light emitted from the light emitting element.

14 Claims, 8 Drawing Sheets

LIGHT EMITTING DISPLAY APPARATUS

CROSS-REFERENCE TO RELATED APPLICATIONS

This application claims the priority of Korean Patent Application No. 10-2018-0096990 filed on Aug. 20, 2018, in the Republic of Korean, the disclosure of which is incorporated herein by reference.

BACKGROUND

Field

The present disclosure relates to a light emitting display apparatus, and more particularly, to a light emitting display apparatus which improves a viewing angle dependency and is capable of ensuring device stability.

Description of the Related Art

Currently, as society enters into a full-scale information era, a field of display apparatuses which visually express electrical information signals has been rapidly developing and studies continue to improve performance of various display apparatuses, such as thin-thickness, light weight, and low power consumption.

Among various display apparatuses, a light emitting display apparatus is a self-emitting display apparatus so that a separate light source is not necessary, which is different from the liquid crystal display apparatus. Therefore, light emitting display apparatuses can be manufactured to have light weight and small thickness. Further, since the light emitting display apparatus is driven at a low voltage, it is advantageous not only in terms of power consumption, but also in terms of color implementation, response speed, viewing angle, and contrast ratio (CR). Therefore, it is expected to be utilized more in various fields.

SUMMARY

A top emission type light emitting display apparatus uses a transmissive material as a cathode to upwardly emit light emitted from a light emitting layer. Even though the cathode has a transmissive characteristic, some of light emitted from the light emitting layer is reflected from the cathode to be directed to the anode and reflected from the anode again. Therefore, light is repeatedly reflected back and forth between the anode and the cathode. In this situation, a micro cavity, in which luminance is improved by the constructive interference of light having a specific wavelength, among light emitted from the light emitting layer, based on the distance between the anode and the cathode, can be implemented.

Therefore, the inventors of the present disclosure recognized that when the micro cavity is implemented to improve the optical efficiency, a front luminance is increased so that the optical efficiency of the front surface is improved. However, the inventors of the present disclosure also recognized that when the micro cavity is implemented, unlike the front luminance, a side luminance is reduced so that it is disadvantageous in terms of the viewing angle. For example, the inventors of the present disclosure recognized that when the micro cavity is implemented, a luminance change and a color shift may be significantly generated in accordance with the viewing angle.

Therefore, the inventors of the present disclosure invented a light emitting display apparatus with a new structure which can implement the micro cavity and also improve the viewing angle dependency, which causes luminance change in accordance with the viewing angle and color shifts in accordance with the viewing angle.

An aspect of the present disclosure is to provide a light emitting display apparatus which can reduce the luminance change in accordance with a viewing angle of a light emitting element.

Another aspect of the present disclosure is to provide a light emitting display apparatus which can minimize or reduce the color shift in accordance with a viewing angle of a light emitting element.

Another aspect of the present disclosure is to reduce the blurring phenomenon which can be generated when a scattering film is applied.

Objects of the present disclosure are not limited to the above-mentioned objects, and other objects, which are not mentioned above, can be clearly understood by those skilled in the art from the following descriptions.

According to an aspect of the present disclosure, a light emitting display apparatus includes a light emitting element on a substrate, an encapsulation unit on the light emitting element, and a scattering film between the encapsulation unit and the light emitting element, or in the encapsulation unit. Therefore, it is possible to minimize or reduce the luminance change and the color shift in accordance with the viewing angle which may be generated when the micro cavity is implemented.

According to another aspect of the present disclosure, a light emitting display apparatus includes a top emission type light emitting element, a first inorganic layer on the light emitting element, a particle cover layer on the first inorganic layer, a second inorganic layer on the particle cover layer, and a scattering film between the second inorganic layer and the light emitting element, the scattering film being configured to reduce a viewing angle dependency of the light emitting element in accordance with a micro cavity. Therefore, the viewing angle dependency which may be generated when the micro cavity is implemented can be improved and an electrical stability of the device can be ensured.

Other detailed matters of the embodiments are included in the detailed description and the drawings.

According to the present disclosure, a luminance change, which may be generated in accordance with the change of the viewing angle when the micro cavity is implemented, can be minimized.

According to the present disclosure, a color shift, which may be generated in accordance with the change of the viewing angle when the micro cavity is implemented, can be reduced.

According to the present disclosure, a scattering film is disposed to be close to a light emitting element, so that the scattering of light emitted from the light emitting element can be suppressed or reduced.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE EMBODIMENT

Advantages and characteristics of the present disclosure and a method of achieving the advantages and characteristics will be clear by referring to embodiments described below in detail together with the accompanying drawings. However, the present disclosure is not limited to the embodiments disclosed herein but will be implemented in various forms. The embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "comprising" used herein are generally intended to allow other components to be added unless the terms are used with the term "only." Any references to singular may include plural unless expressly stated otherwise.

Components are interpreted to include an ordinary error range even if not expressly stated.

When the position relation between two parts is described using the terms such as "on," "above," "below," and "next," one or more parts may be positioned between the two parts unless the terms are used with the term "immediately" or "directly."

When an element or layer is disposed "on" another element or layer, another layer or another element may be interposed directly on the other element or therebetween.

Although the terms "first," "second," and the like are used for describing various components, these components are not confined by these terms. These terms are merely used for distinguishing one component from the other components. Therefore, a first component to be mentioned below may be a second component in a technical concept of the present disclosure.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a light emitting display apparatus display device according to embodiments of the present disclosure will be described in detail with reference to accompanying drawings.

Figure 1:
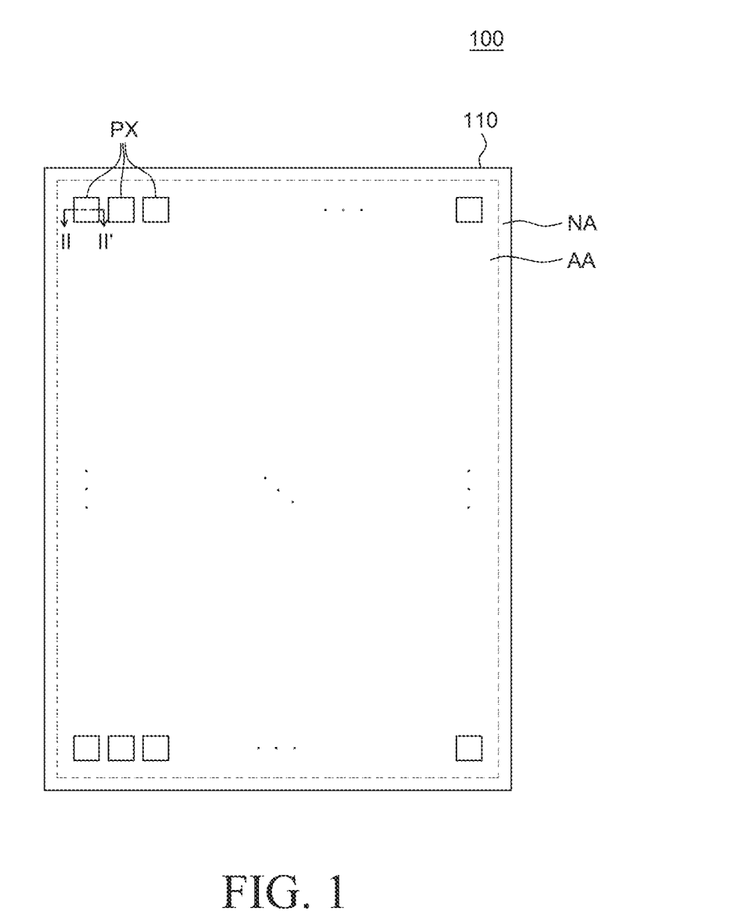
FIG. 1 illustrates a light emitting display apparatus according to an embodiment of the present disclosure.
Figure 2:
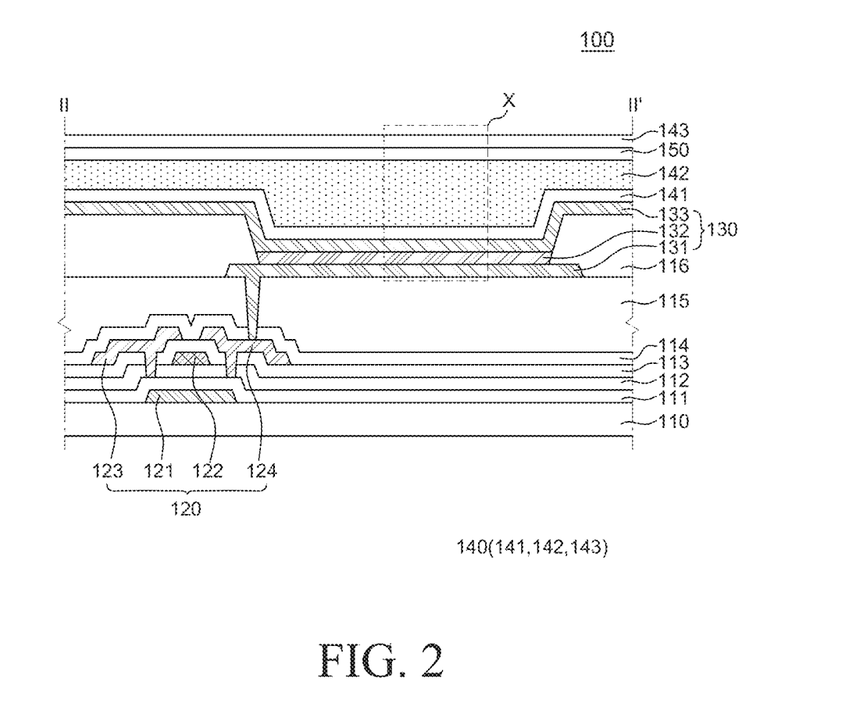
FIG. 2 is a cross-sectional view of a light emitting display apparatus taken along the line II-II' of FIG. 1 according to an embodiment of the present disclosure.

FIG. 1 illustrates a light emitting display apparatus according to an embodiment of the present disclosure. FIG. 2 is a cross-sectional view of a light emitting display apparatus taken along the line II-II' of FIG. 1.

With reference to FIGS. 1 and 2, a light emitting display apparatus 100 includes a substrate 110, a thin film transistor 120, a light emitting element 130, and an encapsulation unit 140.

The substrate 110 is a substrate which supports and protects components of the light emitting display apparatus 100. The substrate 110 can be formed of a glass or a plastic material having flexibility. When the substrate 110 is formed of a plastic material for example, the substrate can be formed of a polyimide (PI), but it is not limited thereto.

The substrate 110 of the light emitting display apparatus 100 includes a display area AA and a non-display area NA.

The display area AA is an area in which an image is displayed in the light emitting display apparatus 100 and a display element and various driving elements for driving the display element are disposed in the display area AA. For example, the display element can be configured by a light emitting element 130 (e.g., an OLED) including an anode 131, a light emitting layer 132, and a cathode 133. Further, various driving elements for driving the display element, such as thin film transistors, capacitors, or wiring lines can be disposed in the display area AA.

A plurality of pixels PX can be included in the display area AA. The pixel PX is a minimum unit which configures an image and each of the plurality of pixels PX can include a light emitting element 130 and a driving circuit. The plurality of pixels PX can emit light having different wavelengths. For example, the plurality of pixels PX can include a red pixel, a green pixel, and a blue pixel.

The non-display area NA is an area where no image is displayed and various components for driving the plurality of pixels PX disposed in the display area AA can be disposed in the non-display area NA. For example, a driving IC which supplies a signal for driving the plurality of pixels PX and a flexible film may be disposed.

The non-display area NA can be an area which encloses the display area AA as illustrated in FIG. 1, but is not limited thereto. For example, the non-display area NA can be an area extending from the display area AA.

Hereinafter, one of the plurality of pixels PX disposed in the display area AA of the light emitting display apparatus 100 will be described in more detail with reference to FIG. 2.

With reference to FIG. 2, a buffer layer 111 is disposed on the substrate 110. The buffer layer 111 serves to improve adhesiveness between layers formed on the buffer layer 111 and the substrate 110, and block or shield alkali components leaked from the substrate 110. The buffer layer 111 can be formed of a single layer of a silicon nitride (SiNx) or a silicon oxide (SiOx), or a multiple layer of a silicon nitride (SiNx) and a silicon oxide (SiOx). However, the buffer layer 111 can be omitted based on a type or a material of the substrate 110, and a structure and a type of a thin film transistor 120.

The thin film transistor 120 is disposed on the buffer layer 111 to drive the light emitting element 130 of the display area AA. The thin film transistor 120 includes an active layer 121, a gate electrode 122, a source electrode 123, and a drain electrode 124. The thin film transistor 120 illustrated in FIG. 2 is a driving transistor and is a top gate structure thin film transistor in which the gate electrode 122 is disposed on the active layer 121. However, it is not limited thereto and the thin film transistor 120 can be implemented as a thin film transistor having a bottom gate structure.

With reference to FIG. 2, the active layer 121 of the thin film transistor 120 is disposed on the buffer layer 111. When the thin film transistor 120 is driven, a channel is formed in the active layer 121. The active layer 121 may be formed of an oxide semiconductor or an amorphous silicon (a-Si), a polycrystalline silicon (poly-Si), or an organic semiconductor.

The gate insulating layer 112 is disposed on the active layer 121. The gate insulating layer 112 can be formed as a single layer of a silicon nitride (SiNx) or a silicon oxide (SiOx) which is an inorganic material, or a multiple layer of a silicon nitride (SiNx) or a silicon oxide (SiOx). In the gate insulating layer 112, a contact hole through which the source electrode 123 and the drain electrode 124 are in contact with a source area and a drain area of the active layer 121 is formed. As illustrated in FIG. 2, the gate insulating layer 112 can be formed on the entire surface of the substrate 110 or patterned to have the same width as the gate electrode 122, but is not limited thereto.

The gate electrode 122 is disposed on the gate insulating layer 112. The gate electrode 122 is disposed on the gate insulating layer 112 to overlap the channel area of the active layer 121. The gate electrode 122 can be one or more of various metal materials, for example, one or more of a molybdenum (Mo), an aluminum (Al), a chrome (Cr), a gold (Au), a titanium (Ti), a nickel (Ni), a neodymium (Nd), and a copper (Cu) or an alloy of two or more of them, or a multiple layer thereof.

The interlayer insulating layer 113 is disposed on the gate electrode 122. The interlayer insulating layer 113 can be formed as a single layer of a silicon nitride (SiNx) or a silicon oxide (SiOx) which is an inorganic material, or a multiple layer of a silicon nitride (SiNx) or a silicon oxide (SiOx). In the interlayer insulating layer 113, a contact hole through which the source electrode 123 and the drain electrode 124 are in contact with the source area and the drain area of the active layer 121 is formed.

The source electrode 123 and the drain electrode 124 are disposed on the interlayer insulating layer 113. The source electrode 123 and the drain electrode 124 are electrically connected to the active layer 121 through contact holes formed in the gate insulating layer 112 and the interlayer insulating layer 113. The source electrode 123 and the drain electrode 124 can be one or more of various metal materials, for example, one or more of a molybdenum (Mo), an aluminum (Al), a chrome (Cr), a gold (Au), a titanium (Ti), a nickel (Ni), a neodymium (Nd), and a copper (Cu) or an alloy of two or more of them, or a multiple layer thereof.

For the convenience of description, in FIG. 2, only a driving transistor among various thin film transistors 120 in the light emitting display apparatus 100 is illustrated, but other transistors such as a switching transistor can also be disposed.

A passivation layer 114 for protecting the thin film transistor 120 is disposed on the thin film transistor 120. A contact hole which exposes the drain electrode 124 of the thin film transistor 120 is formed in the passivation layer 114. Even though in FIG. 2, the contact hole which exposes the drain electrode 124 is formed in the passivation layer 114, a contact hole which exposes the source electrode 123 may also be formed. The passivation layer 114 can be formed as a single layer of a silicon nitride (SiNx) or a silicon oxide (SiOx), or a multiple layer of a silicon nitride (SiNx) or a silicon oxide (SiOx). However, the passivation layer 114 may be omitted depending on the embodiment.

An overcoating layer 115 is disposed to planarize an upper portion of the thin film transistor 120. A contact hole which exposes the drain electrode 124 of the thin film transistor 120 is formed in the overcoating layer 115. Even though in FIG. 2, the contact hole which exposes the drain electrode 124 is formed in the overcoating layer 115, a contact hole which exposes the source electrode 123 can also be formed. The overcoating layer 115 can be formed of one or more of: an acrylic resin, an epoxy resin, a phenol resin, a polyamide resin, a polyimide resin, an unsaturated polyester resin, a polyphenylene resin, a polyphenylene sulfide resin, a benzocyclobutene, and a photoresist.

The light emitting element 130 is disposed on the overcoating layer 115. The light emitting element 130 is formed on the overcoating layer 115 and includes the anode 131 which is electrically connected to the drain electrode 124 of the thin film transistor 120, the light emitting layer 132 disposed on the anode 131, and the cathode 133 formed on the light emitting layer 132.

The anode 131 is disposed on the overcoating layer 115 to be electrically connected to the drain electrode 124 through contact holes formed in the passivation layer 114 and the overcoating layer 115. The anode 131 can be formed of a conductive material having a high work function to supply holes to the light emitting layer 132. For example, the anode 131 can be formed of transparent conductive oxide such as an indium tin oxide (ITO), an indium zinc oxide (IZO), an indium tin zinc oxide (ITZO), a zinc oxide (ZnO), and a tin oxide (TO).

Because the light emitting display apparatus 100 is a top emission type display apparatus, the light emitting element 130 is also configured as a top emission type. Therefore, the anode 131 can include a reflective layer which reflects light emitted from the light emitting layer 132 toward the cathode 133 and a transparent conductive layer which supplies holes to the light emitting layer 132, but is not limited thereto. For example, the anode 131 can include only the transparent conductive layer, and the reflective layer can be a separate component from the anode 131.

Even though in FIG. 2, it is illustrated that the anode 131 is electrically connected to the drain electrode 124 of the thin film transistor 120 through a contact hole, the anode 131 can also be configured to be electrically connected to the source electrode 123 of the thin film transistor 120 through a contact hole by means of the type of the thin film transistor 120 and a design method of the driving circuit.

A bank 116 can be disposed on the anode 131 and the overcoating layer 115. The bank 116 may cover a part or some portion of the anode 131 of the light emitting element 130 to define an emission area. The bank 116 can be formed of an organic material. For example, the bank 116 can be formed one of a polyimide resin, an acrylic resin, or a benzocyclobutene resin, but is not limited thereto.

The light emitting layer 132 is disposed on the anode 131. The light emitting layer 132 is a layer for emitting light having a specific color and includes one of a red light emitting layer, a green light emitting layer, a blue light emitting layer, and a white light emitting layer. Further, the light emitting layer 132 can further include various layers, such as a hole transport layer, a hole injecting layer, an electron injecting layer, or an electron transport layer. Even though in FIG. 2, it is illustrated that the light emitting layer 132 is patterned, the light emitting layer 132 can be formed as one layer over the entire display area AA.

With reference to FIG. 2, a cathode 133 is disposed on the light emitting layer 132. The cathode 133 supplies electrons to the light emitting layer 132. The cathode 133 can be formed of transparent conductive oxide such as an indium tin oxide (ITO), an indium zinc oxide (IZO), an indium tin zinc oxide (ITZO), a zinc oxide (ZnO), and a tin oxide (TO) or a ytterbium (Yb) alloy. Alternatively, the cathode 133 can be formed of a metal material having a very thin thickness.

An encapsulation unit 140 is disposed on the cathode 133. Further, the scattering film 150 is disposed in the encapsulation unit 140.

Hereinafter, the encapsulation unit 140 and the scattering film 150 will be described in more detail with reference to FIG. 3.

Figure 3:
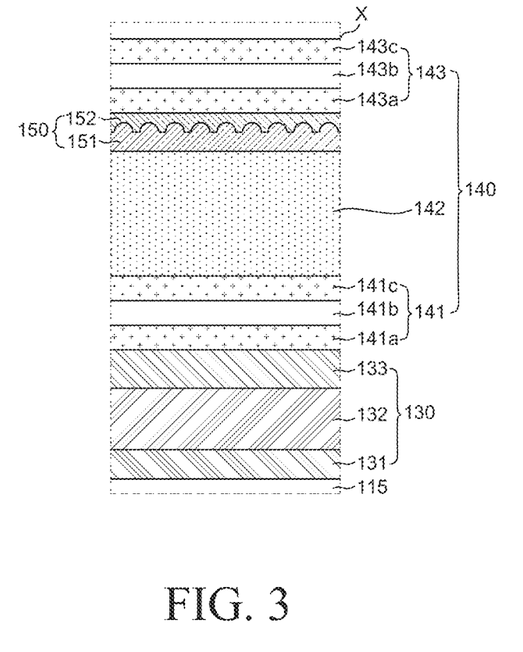
FIG. 3 is an enlarged view of an area X of FIG. 2 according to an embodiment of the present disclosure.

FIG. 3 is an enlarged view of an area X of FIG. 2.

With reference to FIGS. 2 and 3, the encapsulation unit 140 is disposed on the light emitting element 130. For example, the encapsulation unit 140 is disposed on the cathode 133 to cover the light emitting element 130. The encapsulation unit 140 protects the light emitting element 130 from moisture infiltrating from the outside of the light emitting display apparatus 100. The encapsulation unit 140 may include a first encapsulation layer 141, a particle cover layer 142, and a second encapsulation layer 143.

The first encapsulation layer 141 is disposed on the cathode 133. The first encapsulation layer 141 has an excellent blocking effect of moisture infiltration to the light emitting element 130, is deposited at a low temperature, and is formed of a transparent inorganic material. For example, the first encapsulation layer 141 can be formed of an inorganic material, such as a silicon nitride (SiNx), a silicon oxide (SiOx), and an aluminum oxide ($Al_2O_3$), but is not limited thereto.

The first encapsulation layer 141 can have a structure in which one or more high refractive layer and one or more low refractive layer are alternately stacked. For example, the first encapsulation layer 141 can have a structure, in which an inorganic layer having a relatively high refractive index and an inorganic layer having a relatively low refractive index are alternately stacked.

For example, With reference to FIG. 3, the first encapsulation layer 141 can include a first layer 141a, a second layer 141b on the first layer 141a, and a third layer 141c on the second layer 141b. For example, the first layer 141a and the third layer 141c are inorganic layers having a relatively high refractive index and the second layer 141b can be an inorganic layer having a relatively low refractive index. As another example, the first layer 141a and the third layer 141c are inorganic layers having a relatively low refractive index and the second layer 141b can be an inorganic layer having a relatively high refractive index.

With reference to FIG. 3, the particle cover layer 142 is disposed on the first encapsulation layer 141. The particle cover layer 142 is an organic layer which covers foreign matters or particles which can be generated during the manufacturing process to compensate for any step difference caused by the foreign matters or particles. The foreign matters or particles generated during the manufacturing process may cause the defect of the light emitting element 130 and also cause the crack of the inorganic layer such as the first encapsulation layer 141 and the second encapsulation layer 143. Therefore, the particle cover layer 142 serves to cover the crack generated by the foreign matters or particles or compensate for the step difference caused by the foreign matters or particles. Further, the particle cover layer 142 can also serve to planarize the surface on the light emitting element 130.

The particle cover layer 142 can be formed of an organic material. For example, the particle cover layer 142 can be formed one of an acrylic resin or an epoxy resin, but is not limited thereto.

The second encapsulation layer 143 is disposed on the particle cover layer 142. The second encapsulation layer 143 has an excellent blocking effect of moisture infiltration to the light emitting element 130, is deposited at a low temperature, and is formed of a transparent inorganic material. For example, the second encapsulation layer 143 can be formed of an inorganic material, such as a silicon nitride (SiNx), a silicon oxide (SiOx), and an aluminum oxide ($Al_2O_3$).

The second encapsulation layer 143 can have a structure in which one or more high refractive layer and one or more low refractive layer are alternately stacked or formed. That is, the second encapsulation layer 143 can have a structure in which an inorganic layer having a relatively high refractive index and an inorganic layer having a relatively low refractive index are alternately stacked or formed.

For example, with reference to FIG. 3, the second encapsulation layer 143 can include a first layer 143a, a second layer 143b on the first layer 143a, and a third layer 143c on the second layer 143b. For example, the first layer 143a and the third layer 143c are inorganic layers having a relatively high refractive index and the second layer 143b may be an inorganic layer having a relatively low refractive index. As another example, the first layer 143a and the third layer 143c are inorganic layers having a relatively low refractive index and the second layer 143b can be an inorganic layer having a relatively high refractive index.

The scattering film 150 can be disposed inside the encapsulation unit 140. For example, the scattering film 150 is disposed between the particle cover layer 142 and the second encapsulation layer 143. For example, a lower surface of the scattering film 150 can be in contact with the particle cover layer 142 and an upper surface of the scattering film 150 can be in contact with the second encapsulation layer 143.

The scattering film 150 can be configured to improve a viewing angle dependency of the light emitting display apparatus 100. Therefore, the scattering film 150 can be configured by a scattering layer 151 having an uneven shape and a planarization layer 152 which covers the scattering layer 151. For example, the scattering film 150 includes the scattering layer 151 including a plurality of concave portions or a plurality of convex portions and the planarization layer 152 on the scattering layer 151.

The plurality of convex portions or the plurality of concave portions of the scattering layer 151 can be formed by a mask process, but is not limited thereto. Further a diameter of the plurality of convex portions or the plurality of concave portions can be approximately 10 nm to 100 µm, but is not limited thereto.

As illustrated in FIG. 3, the plurality of convex portions or the plurality of concave portions of the scattering layer 151 can be formed in an area corresponding to a position where the light emitting element 130 is formed. However, it is not limited thereto and the plurality of convex portions or the plurality of concave portions of the scattering layer 151 can be formed on the entire surface of the substrate 110.

Even though in FIG. 3, it is illustrated that the plurality of convex portions of the scattering layer 151 has a hemispherical shape, the plurality of convex portions can have a semi-ellipsoidal shape, a pyramidal shape or other various shapes.

The planarization layer 152 which covers the scattering layer 151 is disposed. The planarization layer 152 is an insulating layer which flattens or planarizes the scattering layer 151 on the scattering layer 151. For example, even though the scattering layer 151 which is disposed below the planarization layer 152 has an uneven shape, the planarization layer 152 is disposed so that the second encapsulation layer 143 can be disposed on the planarized surface on the planarization layer 152.

The planarization layer 152 can be formed of a transparent organic material. For example, the planarization layer 152 can be formed of a material which does not outgas during the process of manufacturing the light emitting element or after manufacturing the light emitting element. For example, the planarization layer 152 can be a transparent organic material which does not outgas so that light reflected during the vapor deposition passes therethrough. For example, the planarization layer 152 can be formed of any one of an acrylic resin, an epoxy resin, a phenol resin, a polyamide resin, a polyimide resin, an unsaturated polyester resin, a polyphenylene resin, a polyphenylene sulfide resin, a benzocyclobutene, and a photoresist, but is not limited thereto.

The planarization layer 152 can have a different refractive index from that of the scattering layer 151. When the refractive index of the planarization layer 152 and the refractive index of the scattering layer 151 are equal to each other or have a very small difference, the planarization layer 152 and the scattering layer 151 can serve as one optical layer. That is, when the refractive index of the planarization layer 152 and the refractive index of the scattering layer 151 are equal to each other or have a very small difference, light may not be scattered from an interface between the planarization layer 152 and the scattering layer 151. Therefore, for example, the difference of refractive indexes of the scattering layer 151 and the planarization layer 152 can be approximately 0.05 or larger.

A top emission type light emitting display apparatus uses a transmissive material for a cathode to upwardly emit light emitted from a light emitting layer. Even though the cathode has a transmissive characteristic, some of light emitted from the light emitting layer is reflected from the cathode having a transmissive characteristic to be directed to the anode and reflected from the anode again so that light is repeatedly reflected back and forth between the anode and the cathode. Therefore, the micro cavity can be implemented in the top emission type light emitting display apparatus.

However, when the micro cavity is implemented, it is advantageous in terms of a light efficiency, but as the viewing angle varies, the luminance is changed, and the color shift based on the viewing angle is generated so that the display quality may be degraded. For example, in the light emitting display apparatus which improves the light efficiency using the micro cavity, the intensity of the light and the wavelength characteristic vary depending on the viewing angle, so that there is a problem in that the luminance in accordance with the viewing angle is significantly lowered and the color shift is significant.

Therefore, in the light emitting display apparatus 100 according to the embodiment of the present disclosure, the encapsulation unit 140 having the multi-layered structure having different refractive indexes is formed on the light emitting element 130 to reduce the color shift. Therefore, the micro cavity characteristic can be suppressed or reduced. For example, the first encapsulation layer 141 and the second encapsulation layer 143 of the encapsulation unit 140 can have a structure in which an inorganic layer having a relatively high refractive index and an inorganic layer having a relatively low refractive index are alternately stacked. Therefore, the micro cavity characteristic implemented in the light emitting display apparatus 100 according to the embodiment of the present disclosure can be suppressed so that the luminance degradation and the color shift in accordance with the viewing angle may be reduced.

Further, in the light emitting display apparatus 100 according to the embodiment of the present disclosure, the scattering film 150 is disposed in the encapsulation unit 140. For example, the scattering film 150 is disposed between the particle cover layer 142 and the second encapsulation layer 143. Further, the scattering film 150 includes the scattering layer 151 and the planarization layer 152 having different refractive indexes and the scattering layer 151 includes a plurality of convex portions or a plurality of concave portions. Therefore, the light emitted from the light emitting element 130 is scattered by the scattering film 150 to suppress the micro cavity characteristic and minimize or reduce the luminance change and the color shift in accordance with the viewing angle.

Therefore, the light emitting display apparatus 100 according to the embodiment of the present disclosure can improve the viewing angle dependency which may be caused when the micro cavity is implemented using the encapsulation unit 140 and the scattering film 150.

Further, in the light emitting display apparatus 100 according to the embodiment of the present disclosure, the scattering film 150 is disposed in the encapsulation unit 140. For example, the scattering film 150 can be disposed between the particle cover layer 142 and the second encapsulation layer 143 in the encapsulation unit 140, rather than on the encapsulation unit 140. Therefore, in the light emitting display apparatus 100 according to the embodiment of the present disclosure, as compared with the situation that the scattering film 150 is disposed on the upper portion of the encapsulation unit 140, the blurring phenomenon can be reduced.

The effect related to the viewing angle dependency and the blurring phenomenon of the light emitting display apparatus 100 according to the embodiment of the present disclosure will be described in more detail with reference to FIGS. 6 to 8B.

Figure 4:
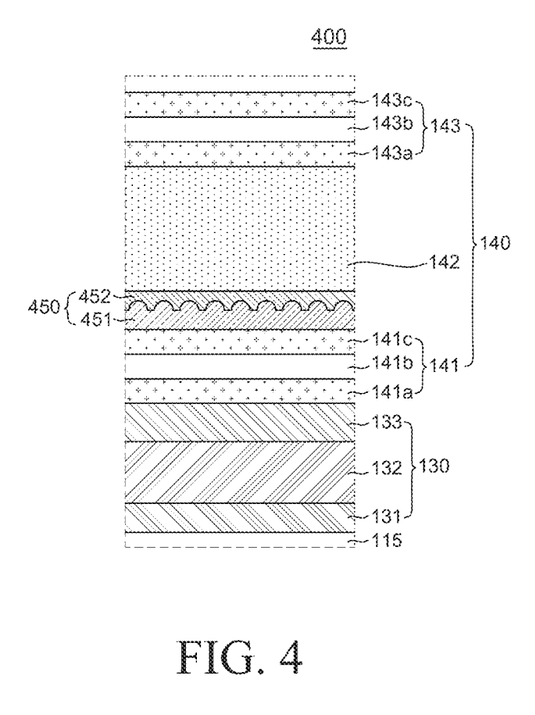
FIG. 4 is an enlarged cross-sectional view of a light emitting display apparatus according to another embodiment of the present disclosure.

FIG. 4 is an enlarged cross-sectional view of a light emitting display apparatus according to another exemplary embodiment of the present disclosure. A configuration of a light emitting display apparatus 400 illustrated in FIG. 4 is substantially the same as the light emitting display apparatus 100 illustrated in FIGS. 1 to 3 except for a position of a scattering film 450, so that a redundant description will be omitted.

With reference to FIG. 4, a scattering film 450 is disposed in the encapsulation unit 140. Specifically, a scattering film 450 is disposed between the first encapsulation layer 141 and the particle cover layer 142. For example, a lower surface of the scattering film 450 can be in contact with the first encapsulation layer 141 and an upper surface of the scattering film 450 can be in contact with the particle cover layer 142.

The scattering film 450 can be configured to improve a viewing angle dependency of the light emitting display apparatus 400. Therefore, the scattering film 450 can be configured by a scattering layer 451 having an uneven shape and a planarization layer 452 which covers the scattering layer 451. The scattering layer 451 and the planarization layer 452 are substantially the same as the scattering layer 151 and the planarization layer 152 which have been described with reference to FIGS. 1 to 3, so that a redundant description will be omitted.

For example, in the light emitting display apparatus 400 according to another embodiment of the present disclosure, the first encapsulation layer 141 and the second encapsulation layer 143 of the encapsulation unit 140 can have a structure in which an inorganic layer having a relatively high refractive index and an inorganic layer having a relatively low refractive index are alternately stacked. Further, in the light emitting display apparatus 400 according to another embodiment of the present disclosure, the scattering film 450 is disposed in the encapsulation unit 140. For example, the scattering film 450 is disposed between the first encapsulation layer 141 and the particle cover layer 142. Therefore, the micro cavity characteristic implemented in the light emitting display apparatus 400 according to another embodiment of the present disclosure can be suppressed or reduced so that the luminance degradation and the color shift in accordance with the viewing angle can be reduced. For example, the display apparatus 400 according to another embodiment of the present disclosure can improve the viewing angle dependency which may be caused when the micro cavity is implemented using the encapsulation unit 140 and the scattering film 450.

Further, in the display apparatus 400 according to another embodiment of the present disclosure, the scattering film 450 is disposed in the encapsulation unit 140. For example, the scattering film 450 can be disposed between the first encapsulation layer 141 and the particle cover layer 142 in the encapsulation unit 140, rather than above the encapsulation unit 140. Therefore, in the display apparatus 400 according to another embodiment of the present disclosure, as compared with the situation that the scattering film 450 is disposed above the encapsulation unit 140, the blurring phenomenon can be reduced.

The effect related to the viewing angle dependency and the blurring phenomenon of the display apparatus 400 according to another embodiment of the present disclosure will be described in more detail with reference to FIGS. 6 to 8B.

Figure 5:
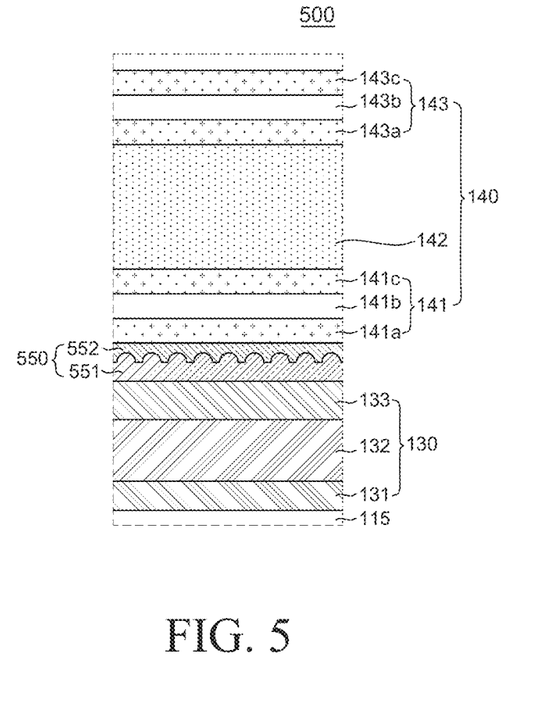
FIG. 5 is an enlarged cross-sectional view of a light emitting display apparatus according to another embodiment of the present disclosure.

FIG. 5 is an enlarged cross-sectional view of a light emitting display apparatus according to another embodiment of the present disclosure. A configuration of a light emitting display apparatus 500 illustrated in FIG. 5 is substantially the same as the light emitting display apparatus 100 illustrated in FIGS. 1 to 3 except for a position of a scattering film 550, so that a redundant description will be omitted.

With reference to FIG. 5, a scattering film 550 is disposed between the encapsulation unit 140 and the light emitting element 130. For example, a lower surface of the scattering film 550 can be in contact with the cathode 133 of the light emitting element 130 and an upper surface of the scattering film 550 can be in contact with the first encapsulation layer 141 of the encapsulation unit 140.

The scattering film 550 can be configured to improve a viewing angle dependency of the light emitting display apparatus 500. Therefore, the scattering film 550 can be configured by a scattering layer 551 having an uneven shape and a planarization layer 552 which covers the scattering layer 551. The scattering layer 551 and the planarization layer 552 are substantially the same as the scattering layer 151 and the planarization layer 152 which have been described with reference to FIGS. 1 to 3, so that a redundant description will be omitted.

For example, in the light emitting display apparatus 500 according to another embodiment of the present disclosure, the first encapsulation layer 141 and the second encapsulation layer 143 of the encapsulation unit 140 can have a structure in which an inorganic layer having a relatively high refractive index and an inorganic layer having a relatively low refractive index are alternately stacked. Further, in the light emitting display apparatus 500 according to another embodiment of the present disclosure, the scattering film 550 is disposed between the encapsulation unit 140 and the light emitting element 130 (e.g., OLED). For example, the scattering film 550 is disposed between the cathode 133 of the light emitting element 130 and the first encapsulation layer 141 of the encapsulation unit 140. Therefore, the micro cavity characteristic implemented in the light emitting display apparatus 500 according to another embodiment of the present disclosure can be suppressed so that the luminance degradation and the color shift in accordance with the viewing angle can be reduced. For example, the light emitting display apparatus 500 according to another embodiment of the present disclosure can improve the viewing angle dependency which may be caused when the micro cavity is implemented using the encapsulation unit 140 and the scattering film 550.

Further, in the light emitting display apparatus 500 according to another embodiment of the present disclosure, the scattering film 550 is disposed below the encapsulation unit 140. For example, the scattering film 550 can be disposed between the light emitting element 130 and the encapsulation unit 140 below the encapsulation unit 140, rather than above the encapsulation unit 140. Therefore, in the light emitting display apparatus 500 according to another embodiment of the present disclosure, as compared with the situation that the scattering film 550 is disposed above the encapsulation unit 140, the blurring phenomenon can be reduced.

The effect related to the viewing angle dependency and the blurring phenomenon of the light emitting display apparatus 500 according to the embodiment of the present disclosure will be described in more detail with reference to FIGS. 6 to 8B.

Figure 6:
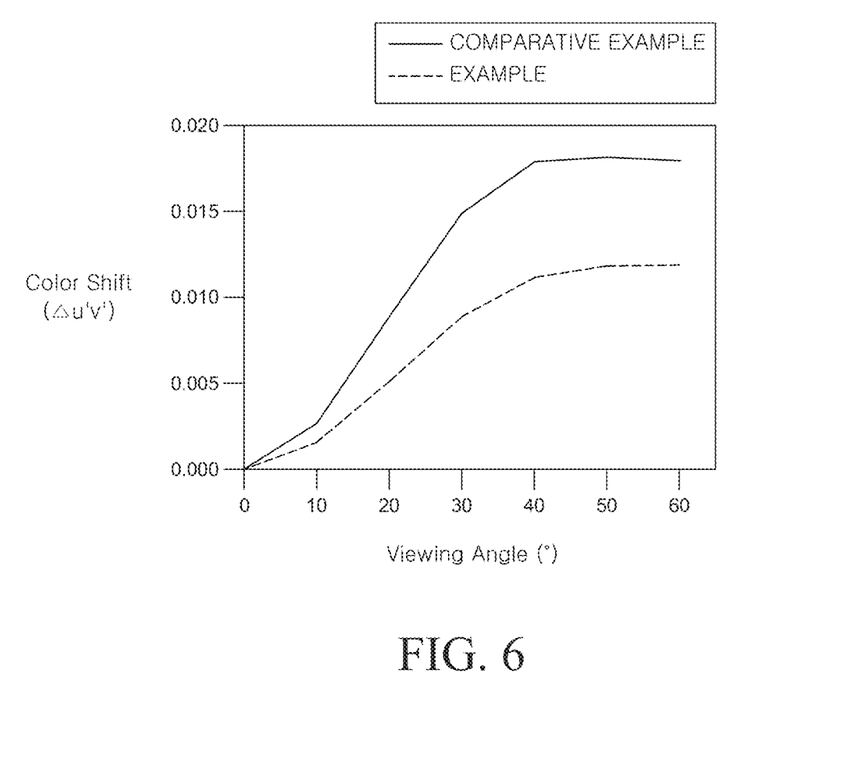
FIG. 6 is a graph illustrating an amount of color shift for different viewing angles of a light emitting display apparatus according to another embodiment of the present disclosure and a comparative example.

FIG. 6 is a graph illustrating a color shift amount for a viewing angle of a light emitting display apparatus according to another embodiment of the present disclosure and a comparative example. With reference to FIG. 6, an X-axis represents a viewing angle (θ) and a Y-axis represents a color coordinate shift amount $\Delta u'v'$ in accordance with the viewing angle. Further, the example is a light emitting display apparatus 500 described with reference to FIG. 5 and the comparative example is a light emitting display apparatus of the example in which the scattering film is not applied.

Referring to FIG. 6, the color coordinate shift amount $\Delta u'v'$ means the difference of the color coordinate which is generated as the viewing angle is changed based on the color coordinate at 0θ when it is viewed from the front. The color coordinate u'v' can be a 1976 uniform chromaticity scale diagram (UCS) coordinate defined in International commission on illumination CIE 15.2, but it is not limited thereto.

With reference to FIG. 6, it is shown that as the viewing angle increases, for example, a viewer of the light emitting display apparatus moves from the front surface to the lateral surface, so that the color shift in the comparative example may be rapidly increased. For example, it is shown that a difference between the color coordinate shift amount Δu'v' at the viewing angle of 10° and the color coordinate shift amount Δu'v' at the viewing angle 40° in the light emitting display apparatus of the comparative example may be approximately 0.015.

In contrast, it is shown that as compared with the light emitting display apparatus of the comparative example, in the light emitting display apparatus 500 according to the embodiment, the increased amount of the color shift in accordance with the increase of the viewing angle is reduced. For example, it is shown that a difference between the color coordinate shift amount Δu'v' at the viewing angle of 10° and the color coordinate shift amount Δu'v' at the viewing angle 40° in the light emitting display apparatus 500 of the example can be lower than 0.01.

Therefore, in the light emitting display apparatus of the comparative example, the color shift is significantly increased in accordance with the viewing angle. However, in the light emitting display apparatus 500 of the example, the color shift which can be generated in accordance with the change of the viewing angle when the micro cavity is implemented can be minimized or reduced.

Even though in FIG. 6, the light emitting display apparatus 500 described with reference to FIG. 5 is used as an example, it is not limited thereto and the light emitting display apparatus 100 or 400 described with reference to FIGS. 1 to 4 as an example also shows the similar graph.

Figure 7:
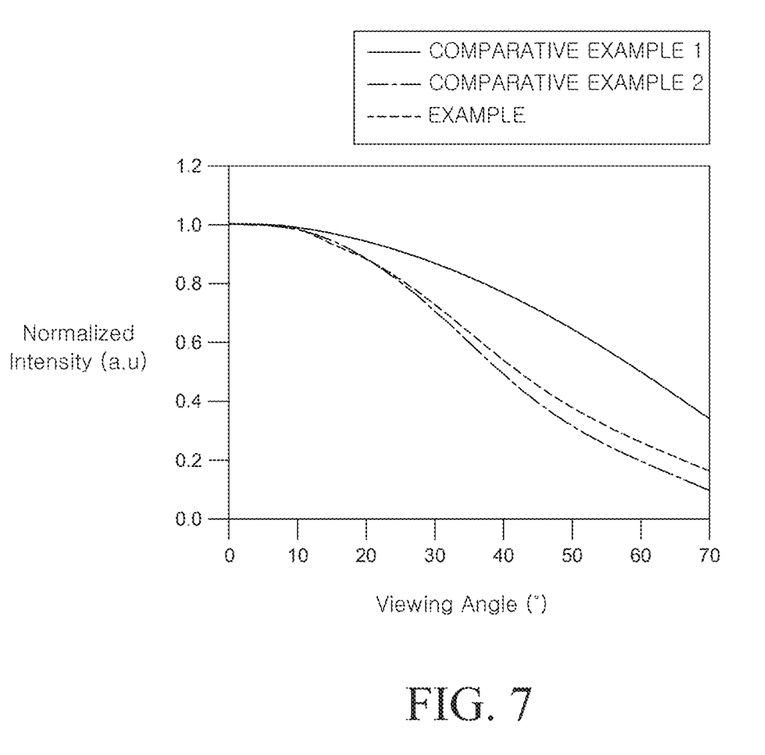
FIG. 7 is a graph illustrating an amount of luminance change for different viewing angles of a light emitting display apparatus according to another embodiment of the present disclosure and a comparative example.

FIG. 7 is a graph illustrating a luminance change amount for a viewing angle of a light emitting display apparatus according to another embodiment of the present disclosure, a comparative example 1, and a comparative example 2. With reference to FIG. 7, an X-axis represents a viewing angle (°) and a Y-axis represents a normalized intensity. Here, the normalized intensity refers to an intensity obtained by normalizing luminance in accordance with the viewing angle to make the maximum luminance value to be 1. Further, the example is the light emitting display apparatus 500 described with reference to FIG. 5 and the comparative example 1 is a luminance change amount in accordance with the viewing angle according to a Lambertian distribution characteristic, and the comparative example 2 is a light emitting display apparatus of the example in which the scattering film is not applied.

With reference to FIG. 7, it is shown that the luminance change amount in accordance with the viewing angle according to the Lambertian distribution characteristic representing a viewing angle distribution characteristic for a natural light source of the comparative example 1 is gently reduced as the viewing angle is increased. In contrast, it is shown that in the light emitting display apparatus of the comparative example 2, as the viewing angle is increased, the luminance is rapidly reduced.

However, the light emitting display apparatus 500 of the example uses the scattering film 550 so that as the viewing angle is increased, the luminance is gently reduced as compared with the light emitting display apparatus of the comparative example 2. Further, the light emitting display apparatus 500 of the example may be closer to the Lambertian distribution characteristic than the light emitting display apparatus of the comparative example 2.

Therefore, the light emitting display apparatus of the comparative example 2 has a problem in that the luminance is significantly increased in accordance with the viewing angle. However, in the light emitting display apparatus 500 of the example, the rapid luminance change which can be generated in accordance with the change of the viewing angle when the micro cavity is implemented can be reduced.

Even though in FIG. 7, the light emitting display apparatus 500 described with reference to FIG. 5 is used as an example, it is not limited thereto and the light emitting display apparatus 100 or 400 described with reference to FIGS. 1 to 4 as an example also shows the similar graph.

Figure 8A:
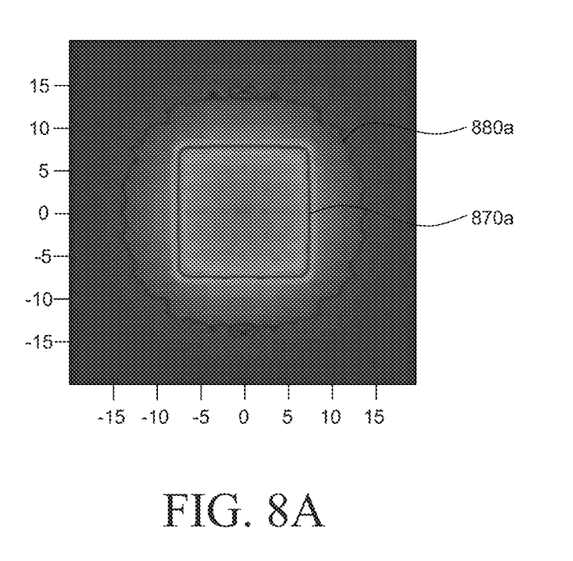
FIGS. 8A and 8B are views for explaining a blurring phenomenon of a light emitting display apparatus according to a comparative example and another embodiment of the present disclosure.
Figure 8B:
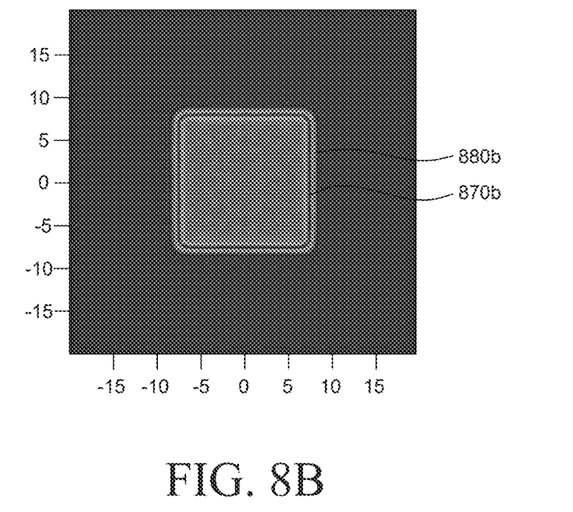

FIGS. 8A and 8B are views for explaining a blurring phenomenon of a light emitting display apparatus according to a comparative example and another embodiment of the present disclosure. For example, FIGS. 8A and 8B are views illustrating second interfaces 880a and 880b in which the luminance is 1/10 of the luminance of the first interfaces 870a and 870b which are boundaries of the pixel with a center of one pixel as an origin. Here, FIG. 8B is a view for an example and illustrates one pixel of the light emitting display apparatus 500 which has been described with reference to FIG. 5 and FIG. 8A is a view for a comparative example and illustrates one pixel when the scattering film 550 of the example moves onto the encapsulation unit 140. In FIGS. 8A and 8B, the X-axis and the Y axis are axes representing a coordinate with a center of the pixel as an origin.

With reference to FIG. 8A, it is shown the image that in the comparative example, as the scattering film is disposed on the encapsulation unit, the distance between the scattering film and the light emitting element is increased so that the blurring phenomenon is significant. Further, an area between the first interface 870a and the second interface 880a is an area where the user recognizes the blurring phenomenon with the eyes. Therefore, it is shown that in the light emitting display apparatus of the comparative example, the first interface 870a and the second interface 880a are significantly spaced apart from each other, so that the blurring phenomenon is significant.

However. With reference to FIG. 8B, in the light emitting display apparatus 500 of the example, it is shown the image that the scattering film 550 is disposed between the encapsulation unit 140 and the light emitting element 130 (e.g., the scattering film 550 is located under the encapsulation unit 140 and above the light emitting element 130), so that the distance between the scattering film 550 and the light emitting element 130 is minimized and thus the blurring phenomenon hardly occurs. For example, the area between the first interface 870b and the second interface 880b is an area where the user recognizes the blurring phenomenon with the eyes. However, as seen from FIG. 8B, in the light emitting display apparatus 500 of the example, the corresponding area is too narrow. For example, it is shown that the distance between the first interface 870b and the second interface 880b is very small, so that it is shown that the blurring phenomenon is hardly generated.

Even though in FIGS. 8A and 8B, the light emitting display apparatus 500 described with reference to FIG. 5 is used as an example, it is not limited thereto and the light emitting display apparatus 100 or 400 described with reference to FIGS. 1 to 4 as an example also shows the similar graph. For example, also in the light emitting display apparatuses 100 and 400, the scattering film 150 and 450 are disposed in the encapsulation unit 140, rather than above the encapsulation unit 140, so that the distance between the scattering film 150 and 450 and the light emitting element 130 can be smaller than that of the comparative example. Therefore, also in the light emitting display apparatus 100 and 400, the blurring phenomenon can be reduced as compared with the comparative example.

A light emitting display apparatus according to an embodiment of the present disclosure may be described as follows.

A light emitting display apparatus according to an embodiment of the present disclosure comprises a light emitting element on a substrate; an encapsulation unit on the light emitting element; and a scattering film between the encapsulation unit and the light emitting element, or in the encapsulation unit.

According to some embodiments of the present disclosure, the scattering film may be configured to scatter light emitted from the light emitting element.

According to some embodiments of the present disclosure, the encapsulation unit may include a first encapsulation layer including one or more high refractive index layers and one or more low refractive index layers are alternately stacked; a particle cover layer on the first encapsulation layer; and a second encapsulation layer including one or more high refractive index layers and one or more low refractive index layers are alternately stacked.

According to some embodiments of the present disclosure, the scattering film may be between the first encapsulation layer and the particle cover layer. The first encapsulation layer may be between the light emitting element and the scattering film.

According to some embodiments of the present disclosure, an upper surface of the scattering film may contact a lower surface of the particle cover layer, and a lower surface of the scattering film may contact an upper surface of the first encapsulation layer.

According to some embodiments of the present disclosure, the scattering film may be between the particle cover layer and the second encapsulation layer, and the first encapsulation layer is disposed between the light emitting element and the particle cover layer.

According to some embodiments of the present disclosure, an upper surface of the scattering film contacts a lower surface of the second encapsulation layer, and a lower surface of the scattering film contacts an upper surface of the particle cover layer.

According to some embodiments of the present disclosure, the scattering film may be between the light emitting element and the encapsulation unit.

According to some embodiments of the present disclosure, an upper surface of the scattering film contacts a lower surface of the encapsulation unit, and a lower surface of the scattering film contacts a cathode of the light emitting element.

According to some embodiments of the present disclosure, the scattering film may include a scattering layer including a plurality of concave portions or a plurality of convex portions; and a planarization layer on the scattering layer.

According to some embodiments of the present disclosure, the plurality of convex portions or the plurality of concave portions may have one of a hemispherical shape, a semi-ellipsoidal shape, and a pyramidal shape.

According to some embodiments of the present disclosure, the scattering layer may have a refractive index different from a refractive index of the planarization layer.

According to some embodiments of the present disclosure, a difference between the refractive index of the scatting layer and the refractive index of the planarization layer may be greater than or equal to 0.05.

According to some embodiments of the present disclosure, the plurality of concave portions or a plurality of convex portions may be approximately 10 nm to 100 μm in height or depth.

A light emitting display apparatus according to an embodiment of the present disclosure comprises a top emission type light emitting element on a substrate; a first inorganic layer on the light emitting element; a particle cover layer on the first inorganic layer; a second inorganic layer on the particle cover layer; and a scattering film between the second inorganic layer and the light emitting element, the scattering film being configured to reduce a viewing angle dependency of the light emitting element in accordance with a micro cavity.

According to some embodiments of the present disclosure, the scattering film may be on an upper surface of one of the light emitting element, the first inorganic layer, and the particle cover layer.

According to some embodiments of the present disclosure, the scattering film may include a scattering layer including a plurality of concave portions or a plurality of convex portions; and a planarization layer on the scattering layer, wherein a difference between a refractive index of the scattering layer and a refractive index of the planarization layer may be greater than or equal to 0.05.

According to some embodiments of the present disclosure, the scatting layer may be between the planarization layer and the top emission type light emitting element.

According to some embodiments of the present disclosure, the first inorganic layer and the second inorganic layer may have a structure in which layers having different refractive indexes are alternately stacked.

According to some embodiments of the present disclosure, a lower surface of scattering film may contact a cathode of the top emission type light emitting element.

According to some embodiments of the present disclosure, the scattering film may be between the second inorganic layer and the first inorganic layer.

Although the exemplary embodiments of the present disclosure have been described in detail with reference to the accompanying drawings, the present disclosure is not limited thereto and can be embodied in many different forms without departing from the technical concept of the present disclosure. Therefore, the embodiments of the present disclosure are provided for illustrative purposes only but not intended to limit the technical concept of the present disclosure. The scope of the technical concept of the present disclosure is not limited thereto. Therefore, it should be understood that the above-described embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A light emitting display apparatus, comprising:
a light emitting element disposed on a substrate;
an encapsulation unit disposed on the light emitting element; and
a scattering film disposed inside the encapsulation unit, wherein the scattering film is configured to scatter light emitted from the light emitting element,
wherein the encapsulation unit includes a first encapsulation layer including one or more high refractive index layers and one or more low refractive index layers alternately stacked, a particle cover layer disposed on the first encapsulation layer, and a second encapsulation layer including one or more high refractive index layers and one or more low refractive index layers alternately stacked, and wherein the scattering film is disposed between the particle cover layer and the second encapsulation layer, and the first encapsulation layer is disposed between the light emitting element and the particle cover layer.

2. The light emitting display apparatus of claim 1, wherein an upper surface of the scattering film contacts a lower surface of the second encapsulation layer, and a lower surface of the scattering film contacts an upper surface of the particle cover layer.

3. The light emitting display apparatus of claim 1, wherein the scattering film includes:
a scattering layer including a plurality of concave portions or a plurality of convex portions; and
a planarization layer disposed on the scattering layer.

4. The light emitting display apparatus of claim 3, wherein the plurality of convex portions or the plurality of concave portions have one of a hemispherical shape, a semi-ellipsoidal shape, and a pyramidal shape.

5. The light emitting display apparatus of claim 3, wherein the scattering layer has a refractive index different from a refractive index of the planarization layer.

6. The light emitting display apparatus of claim 5, wherein a difference between the refractive index of the scattering layer and the refractive index of the planarization layer is greater than or equal to 0.05.

7. The light emitting display apparatus of claim 3, wherein the plurality of concave portions or the plurality of convex portions are 10 nm to 100 pm in height or depth.

8. A light emitting display apparatus, comprising:
a light emitting element disposed on a substrate;
an encapsulation unit disposed on the light emitting element; and
a scattering film disposed between the encapsulation unit and the light emitting element,
wherein the scattering film is configured to scatter light emitted from the light emitting element,
wherein the encapsulation unit includes a first encapsulation layer including one or more high refractive index layers and one or more low refractive index layers alternately stacked, a particle cover layer disposed on the first encapsulation layer, and a second encapsulation layer including one or more high refractive index layers and one or more low refractive index layers alternately stacked,
wherein the first encapsulation layer is disposed between the light emitting element and the particle cover layer,
wherein the scattering film is disposed between the light emitting element and the encapsulation unit, and
wherein an upper surface of the scattering film contacts a lower surface of the encapsulation unit, and a lower surface of the scattering film contacts a cathode of the light emitting element.

9. A light emitting display apparatus, comprising:
a top emission type light emitting element on a substrate;
a first inorganic layer disposed on the top emission type light emitting element;
a particle cover layer disposed on the first inorganic layer;
a second inorganic layer disposed on the particle cover layer; and
a scattering film disposed between the second inorganic layer and the top emission type light emitting element,
wherein the scattering film is configured to reduce a viewing angle dependency of the top emission type light emitting element in accordance with a micro cavity,
wherein the first inorganic layer includes one or more high refractive index layers and one or more low refractive index layers alternately stacked,
the second inorganic layer includes one or more high refractive index layers and one or more low refractive index layers alternately stacked, and
wherein the first inorganic layer is disposed between the top emission type light emitting element and the particle cover layer.

10. The light emitting display apparatus of claim 9, wherein the scattering film is disposed on an upper surface of one of the top emission type light emitting element, the first inorganic layer, and the particle cover layer.

11. The light emitting display apparatus of claim 9, wherein the scattering film includes:
a scattering layer including a plurality of concave portions or a plurality of convex portions; and
a planarization layer disposed on the scattering layer,
wherein a difference between a refractive index of the scattering layer and a refractive index of the planarization layer is greater than or equal to 0.05.

12. The light emitting display apparatus of claim 11, wherein the scattering layer is disposed between the planarization layer and the top emission type light emitting element.

13. The light emitting display apparatus of claim 9, wherein the scattering film is disposed between the second inorganic layer and the first inorganic layer.

14. A light emitting display apparatus, comprising:
a top emission type light emitting element on a substrate;
a first inorganic layer disposed on the top emission type light emitting element;
a particle cover layer disposed on the first inorganic layer;
a second inorganic layer disposed on the particle cover layer; and
a scattering film disposed between the first inorganic layer and the top emission type light emitting element,
wherein the scattering film being configured to reduce a viewing angle dependency of the top emission type light emitting element in accordance with a micro cavity,
wherein the first inorganic layer includes one or more high refractive index layers and one or more low refractive index layers alternately stacked, the second inorganic layer includes one or more high refractive index layers and one or more low refractive index layers alternately stacked, and
wherein the first inorganic layer is disposed between the top emission type light emitting element and the particle cover layer,
an upper surface of the scattering film contacts a lower surface of the first inorganic layer, and
a lower surface of the scattering film contacts a cathode of the top emission type light emitting element.

* * * * *